United States Patent [19]

Tsao

[11] Patent Number: 4,752,815
[45] Date of Patent: Jun. 21, 1988

[54] METHOD OF FABRICATING A SCHOTTKY BARRIER FIELD EFFECT TRANSISTOR

[75] Inventor: Kuey-Yeou Tsao, Barrington, Ill.

[73] Assignee: Gould Inc., Rolling Meadows, Ill.

[21] Appl. No.: 815,609

[22] Filed: Jan. 2, 1986

Related U.S. Application Data

[62] Division of Ser. No. 621,282, Jun. 15, 1984, Pat. No. 4,587,710.

[51] Int. Cl.⁴ .................... H01L 29/78; H01L 29/48; H01L 29/04
[52] U.S. Cl. .................... 357/23.9; 357/15; 357/59
[58] Field of Search .............. 357/15, 23.9, 59 G

[56] References Cited

U.S. PATENT DOCUMENTS 4,324,038 4/1982 Chang et al. .................... 357/65

FOREIGN PATENT DOCUMENTS 58-44766 3/1983 Japan ................................ 357/23.9
2103419 8/1981 United Kingdom .............. 357/23.4

OTHER PUBLICATIONS

Kircher et al. "Fabricating a Gate Field-Effect Transistor" IBM Tech. Disc. Bulletin vol. 13, No.3, 1970, pp. 646–648.

Primary Examiner—Andrew J. James
Assistant Examiner—Robert P. Limanek

[57] ABSTRACT

A method of fabricating a Schottky barrier MOSFET wherein a polysilicon gate chip is disposed adjacent the drain and source regions of a single crystal silicon substrate surface, and a metal is deposited on the top surface of the gate chip and the drain and source regions of the substrate surface by direct reaction of the silicon of the surfaces with a compound of a tungsten or molybdenum. Preferably, the sidewalls of the gate chip are masked during the deposition of metal to avoid the formation of a metal bridge between the gate and drain or the gate and source.

6 Claims, 6 Drawing Sheets

METHOD OF FABRICATING A SCHOTTKY BARRIER FIELD EFFECT TRANSISTOR

This application is a division of application Ser. No. 621,282, filed June 15, 1984, now U.S. Pat. No. 4,587,710.

BACKGROUND OF THE INVENTION

1. Field of the Invention

This invention relates generally to transistors and, more particularly, this invention relates to a method of fabricating a Schottky barrier field effect transistor.

2. Description of Prior Art

Metal-oxide-silicon field effect transistors (MOSFETs) are well known. Schottky MOSFETs exhibit several advantages over conventional MOSFETs, namely reduced junction depth, lower series resistance (drain to source) and lower contact resistance.

Platinum silicide (PtSi) Schottky MOSFETs have been proposed in the literature by Bell Laboratories researchers. See, for example, C.J. Koeneke et al, "Schottky MOSFET for VLSI" in IEDM 81 (IEEE, Washington, D.C.), December, 1981 at pp. 367-370, and "Lightly Doped Schottky MOSFET", in IEDM 82 (IEEE, Washington, D.C.), December, 1982 at pp. 466-469. In such platinum silicide Schottky MOSFETs, the inversion channel under the gate cannot extend to the source and the drain. Therefore, there is a potential barrier between the channel and source, and between the channel and drain in such MOSFET devices.

In the fabrication of MOSFET devices by prior physical vapor deposition methods (i.e. evaporation or sputtering), it is difficult or impossible to avoid a metal bridge between the gate and the source and/or between the gate and the drain, resulting in irregular $I_{DS}$-$VV_{DS}$ characteristics accompanied by undesirable leakage current levels.

SUMMARY OF THE INVENTION

It is an object of the invention to overcome one or more of the problems described above.

According to the present invention, a Schottky Barrier MOSFET is fabricated by a method wherein tungsten or molybdenum is deposited on a polysilicon gate conductor, and on the drain and source regions of a silicon substrate. Tungsten or molybdenum deposition is accomplished by utilizing the direct reaction of $WF_6$ or $MoF_6$, respectively, with silicon according to the equations:

While $WF_6$ and $MoF_6$ each react with silicon to deposit metal directly thereon, $WF_6$ and $MoF_6$ do not react directly with silicon dioxide at low temperatures. Due to the direct reaction of $WF_6$ or $MoF_6$ with silicon, tungsten or molybdenum can be deposited directly underneath the edge area of the polysilicon gate and will not attack the sandwiched oxide layer between the gate and the source and drain region.

As a result, regular and controllable $I_{DS}$-$V_{DS}$ device characteristics are obtainable, with low leakage current values. Very shallow junction depths are obtainable. Additionally, the sheet resistance of the gate area made according to the invention is reduced by a factor of up to 10 as compared to prior polysilicon gate MOSFET devices. The signal propogation speed can be increased accordingly.

Further objects and advantages of the invention will be apparent to those skilled in the art from a review of the following detailed description taken in conjunction with the drawings and the appended claims.

DETAILED DESCRIPTION OF THE INVENTION

Figure 1:
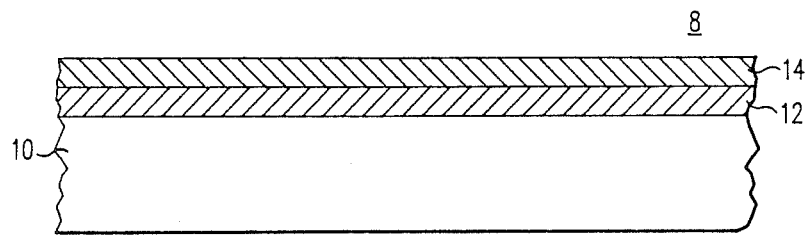
FIGS. 1-15 are cross-sectional representations of a MOSFET wafer showing sequentially the major fabrication steps employed in implementing a preferred embodiment of the present invention; and, FIG. 16 is a schematic diagram of a system for chemical vapor deposition of tungsten or molybdenum onto a polysilicon or single crystalline silicon surface.

My copending, commonly assigned U.S. Pat. application Ser. No. 521,500 filed Aug. 8, 1983, the disclosure of which is hereby incorporated by reference, discloses the reactions between $WF_6$ or $MoF_6$ and silicon according to the following equations:

By either of the foregoing reactions, tungsten or molybdenum is selectively deposited on a silicon substrate and silicon is consumed in the process, and a harmless by-product ($SiF_4$), which is generally nonreactive with respect to semiconductor materials, is produced.

As disclosed in more detail in application Ser. No. 521,500, the polycrystalline or single crystal silicon surface upon which tungsten or molybdenum is to be deposited is treated by contact with a low power plasma of argon or another inert gas in order to enhance the nucleation sites on the surface of the silicon or polysilicon to provide increased available bonds for metal deposition. Typically the plasma treatment may last from 2 to 30 minutes at a power range of 2W to 50W. Preferably, the power range is on the order to 5W and the treatment time is on the order of 5 minutes. Any of a variety of suitable reactors, such as a barrel reactor or a flat plate reactor, for example, may be used, and the initial temperature of the reactor chamber is not critical and may vary widely depending on other applications.

According to the present invention, a silicon dioxide ($SiO_2$) chip is formed between a polysilicon gate chip and a single crystal silicon substrate. The polysilicon is typically of the doped N-type. Preferably, but not necessarily, the sidewalls of the polysilicon gate chip, and the interface between the silicon dioxide chip and the gate chip, are masked by a protective silicon dioxide sidewall layer, and the edges of the silicon dioxide chip under the gate are etched.

Tungsten or molybdenum metal is then deposited on the drain and source regions defined by the single crystal silicon substrate adjacent the gate and on the top of the gate chip. Etching of the silicon dioxide chip between the substrate and the gate allows the deposited metal to extend underneath the edge of the gate. The presence of the sidewall oxide mask prevents metal deposition on the sidewalls of the gate, thus avoiding a metal bridge between the gate and the source and the gate and the drain.

In the preferred embodiment of the inventive method, the sidewalls of the polysilicon gate are masked by polysilicon oxide. Preferably, such oxide is provided to the gate sidewalls under steam oxidation conditions simultaneously with the growth of an oxide layer on the silicon substrate. Since doped polysilicon oxidizes at a faster rate than does single crystal silicon, the gate sidewalls will grow an oxide layer at a faster rate than will the substrate. Thus, when the substrate oxide is removed by etching, a protective mask of oxide remains on the sidewalls of the polysilicon gate.

Most preferably, the top of the polysilicon gate will also be protected during oxide formation, as by a protective $Si_3N_4$ mask overlying an $SiO_2$ layer on the top of the gate. The $Si_3N_4$ layer is removed by $CF_4$ plasma, followed by etching of the top of the gate and the substrate surfaces.

With reference now to FIGS. 1-15, a preferred method of forming a Schottky barrier MOSFET according to the invention will be described in detail.

FIG. 1 illustrates a MOSFET wafer, generally designated 8, comprising a substrate 10 of N-type single crystal silicon, with a layer 12 of silicon dioxide and a layer 14 of silicon nitride ($Si_3N_4$) deposited thereon. Both layers 12 and 14 are formed by conventional means, and the oxide layer is typically of a thickness of 800Å, with a nitride layer thickness of about 1200Å.

Figure 2:
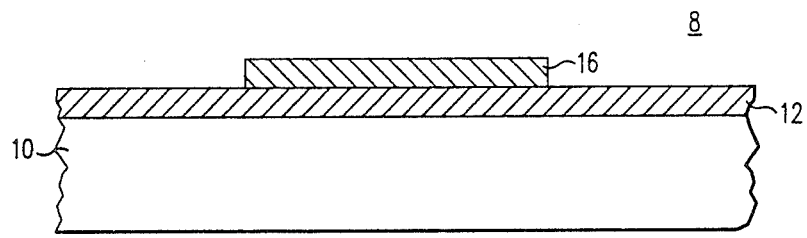
Figure 3:
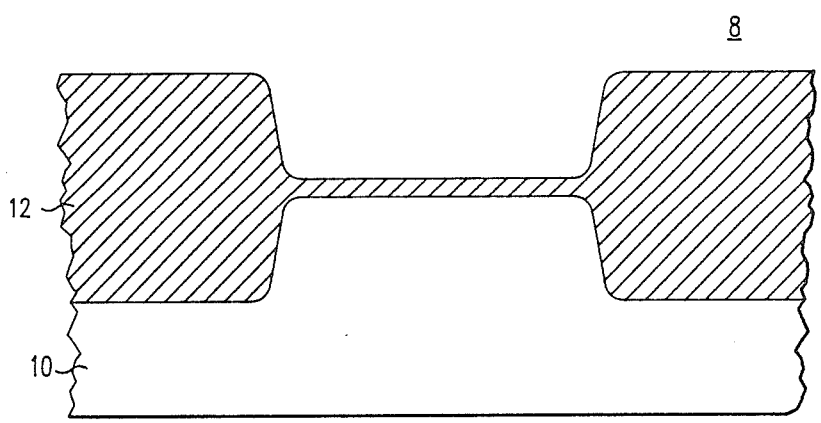

In FIG. 2, a nitride chip 16 has been formed by photolithography and plasma etching of the nitride layer 14. After formation of the chip 16, the structure of FIG. 2 is subjected to steam oxidation, typically at a temperature of about 1000° C., to increase the thickness of the oxide chip 12 in those regions not masked by the nitride chip 16. Following oxidation, the nitride chip 16 is removed, as by plasma or chemical etching, to provide the structure of FIG. 3.

Figure 4:
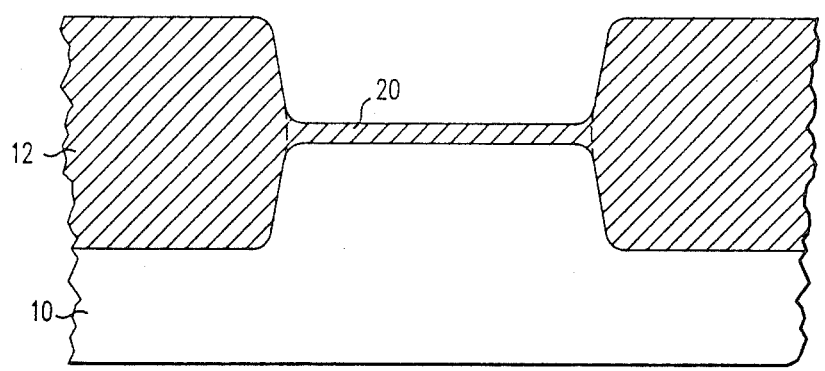

As represented in FIG. 4, the oxide in the region 20 of the layer 12 between the dotted lines is removed by conventional means and regrown in order to reduce mechanical stresses in the structure. Also, ion implantation may be effected in order to tailor the threshold, by conventional means.

Figure 5:
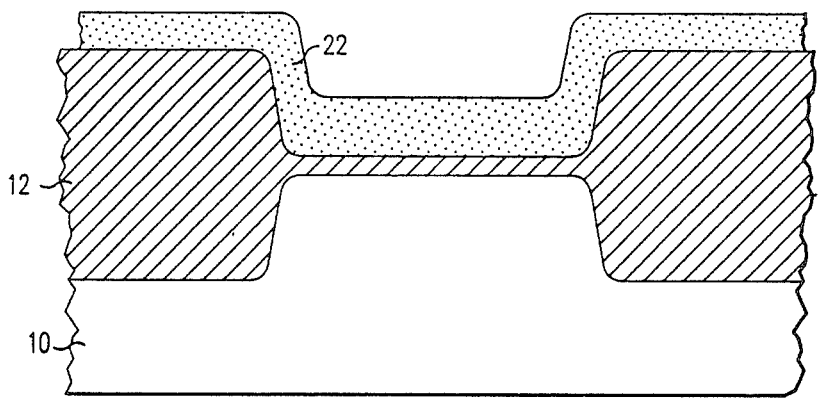
Figure 6:
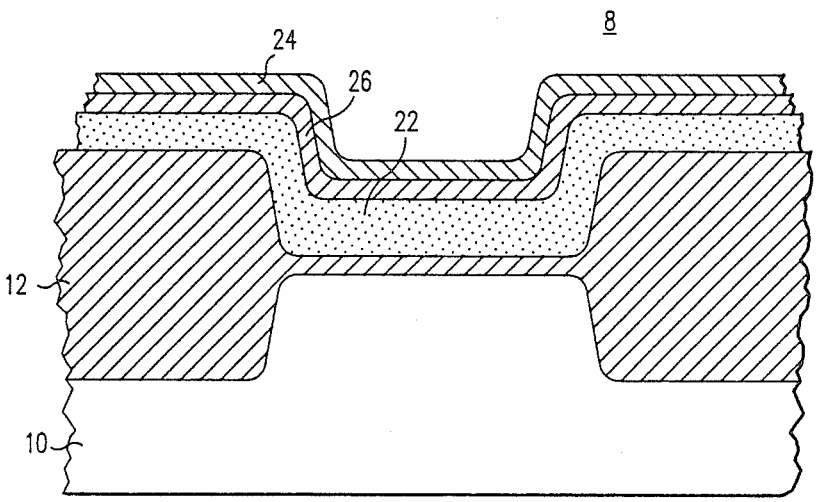

Next, N-doped polysilicon is deposited in a layer 22 as shown in FIG. 5 or, alternatively, a polysilicon layer 22 is deposited on the oxide layer 12, followed by phosphorous or equivalent doping thereof.

After deposition of the doped polysilicon layer 22, a layer 24 of silicon nitride ($Si_3N_4$) is deposited over the polysilicon layer 22, optionally with an $SiO_2$ layer 26 disposed between the polysilicon and silicon nitride layers 22 and 24. The silicon oxide layer is optional, and can be omitted if reactive ion etching is to be employed in the next step. However, if plasma etching is to be employed, the $SiO_2$ layer should be included.

Figure 7:
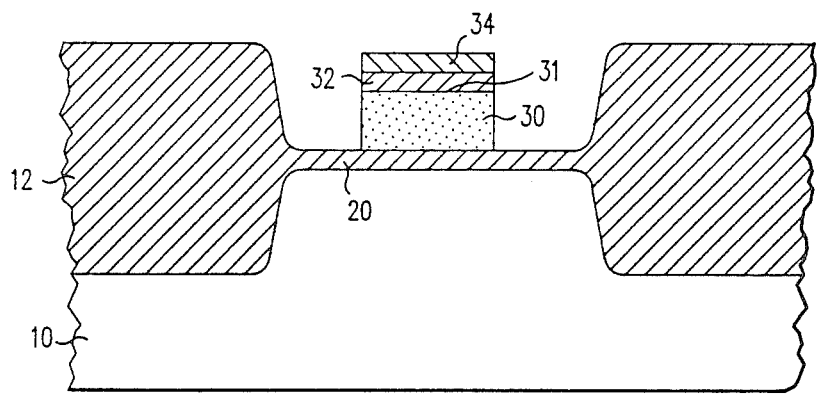

Following silicon nitride deposition, a polysilicon gate structure 28 is formed, as seen in FIG. 7, by photolithography and plasma or reactive ion etching. A polysilicon gate chip 30 is disposed directly on the silicon oxide layer 20, and is masked on its upper surface 31 by a second silicon dioxide layer 32 and a silicon nitride layer 34 which remain from the layers 26 and 24, respectively.

Figure 8:
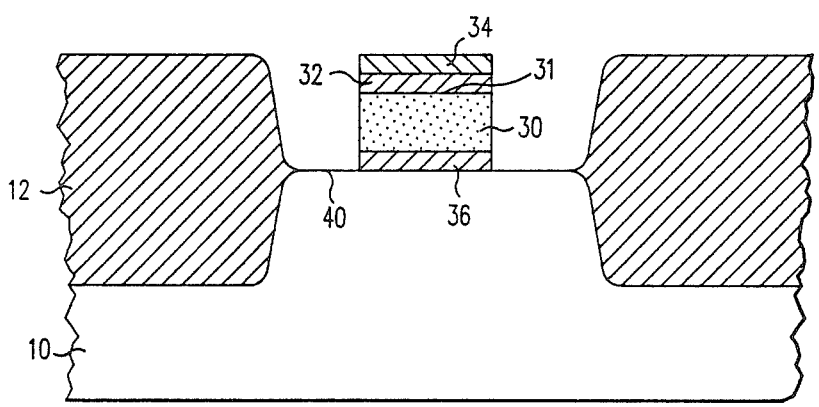

As seen in FIG. 8, the oxide layer 20 is then etched, preferably by a chemical agent such as hydrofluoric acid (HF) to leave a single crystal gate oxide chip 36 sandwiched between the polysilicon gate chip 30 and the silicon substrate 10. A silicon surface 40 adjacent the sidewalls of the gate structure 28 is exposed.

Figure 9:
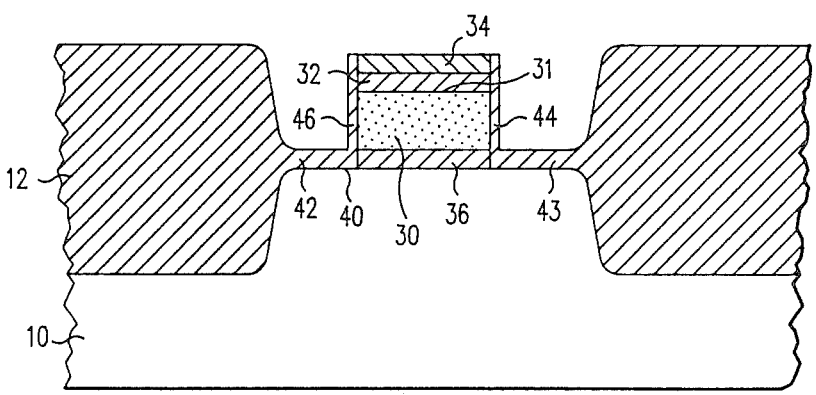

In FIG. 9, the deposition of a silicon dioxide mask on the sidewalls of the polysilicon gate chip 30 is illustrated. By subjecting the structure of FIG. 8 to steam oxidation at, for example, 900° C., a silicon dioxide layer 42 is grown on the silicon surface 40, and sidewall oxide layers 44 and 46 are grown on the sidewalls of the polysilicon gate chip 30. Since doped polysilicon oxidizes at a faster rate than does single crystal silicon, the sidewall oxide layers 44 and 46 are substantially thicker than the oxide layer 42 deposited on the silicon surface 40.

It is this oxidative rate difference that allows the formation of silicon dioxide layers of different thicknesses on different components of the MOSFET wafer 8 in the same oxidation step. This in turn allows the subsequent selective removal of oxide layers to allow direct metal deposition by reaction with selected silicon surfaces.

After formation of the structure of FIG. 9, the silicon nitride layer 34 is removed as by $CF_4$ plasma or wet chemical etching to result in a polysilicon gate chip 30 surrounded on its sides and top by silicon dioxide layers 44 and 46, and 32, respectively, with a silicon dioxide chip 6 (incorporated in the layer 42) disposed between the chip 30 and the substrate 10.

Figure 10:
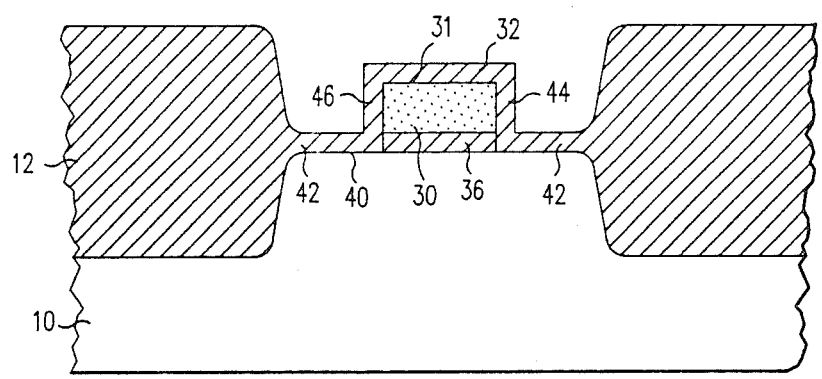

After formation of the structure of FIG. 10, the oxide layer 42, except for the chip 36, and the oxide layer 32 are removed, as by chemical etching with hydrofluoric acid. Since the sidewall layers 44 and 46 are thicker than the layers 42 and 32, the layers 44 and 46 remain, though reduced in thickness, after etching. Typically, the thickness of the sidewalls 44 and 46 will be greater than or equal to about 60Å. Very preferably, undercuts 50 and 52 are provided by overetching the oxide chip 42 by about 10-15%, preferably 15%.

Optionally, $BF_2^+$ ion implantation in the drain gate and source regions 54 and 56, respectively, is accomplished at this step in the procedure. This helps reduce leakage current and improves current capability from the source to the drain.

Figure 12:
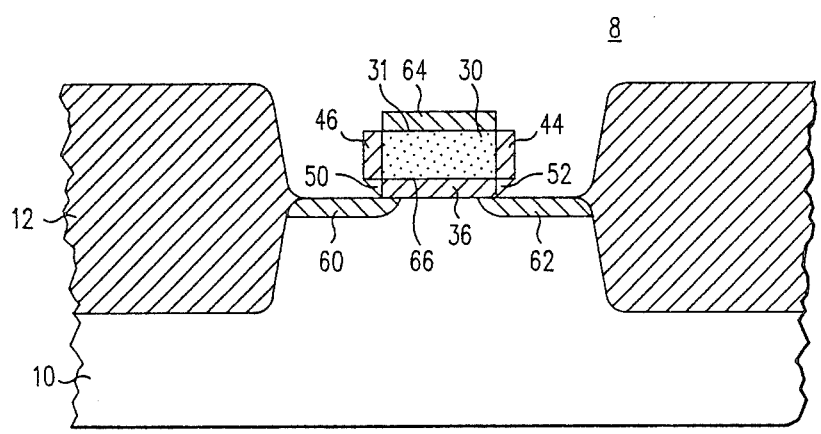

FIG. 12 illustrates the result of low pressure chemical vapor deposition (LPCVD) of tungsten or molybdenum by means of the reactions (1) and (2) given above. The preferred apparatus and conditions for effecting such metal deposition are detailed in application Ser. No. 521,500 and are summarized below with reference to FIG. 16.

By means of reaction (1) or (2), a drain contact 60, a source contact 62, and a gate contact 64 are formed, with consumption of the single crystal silicon of the substrate 10 in the case of contacts 60 and 62, and consumption of the polysilicon 30 in the case of the contact 64. Due to the undercuts 50 and 52, the drain and source contacts 60 and 62, respectively, extend under the sidewall edges of the gate 30. The presence of sidewall oxide masks 46 and 44 on the chip 30 prevents a metal bridge between the gate, source and drain.

Additionally, the sidewalls 46 and 44 prevent metal deposition in the interface 66 between the gate chip 30 and the oxide layer 36. This positively eliminates the formation of a metal bridge, thus minimizing leakage current.

It has been found that the deposition of tungsten or molybdenum on the upper gate surface 31 very advantageously lowers sheet resistance by a factor on the order of 10 (e.g., from about 20 ohms per square to about 2-3 ohms per square, as compared to prior Schottky MOSFET structures).

Figure 13:
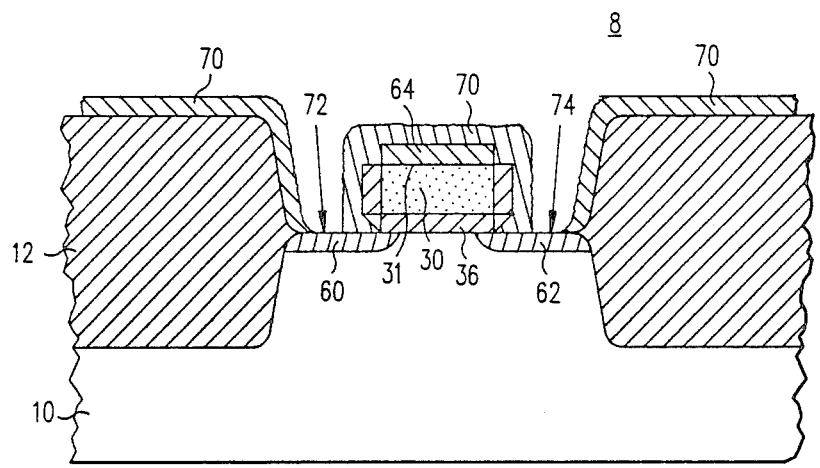
Figure 14:
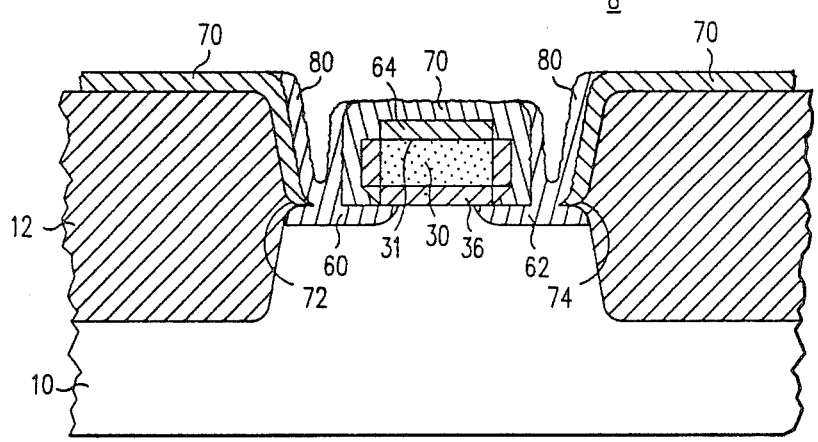
Figure 15:
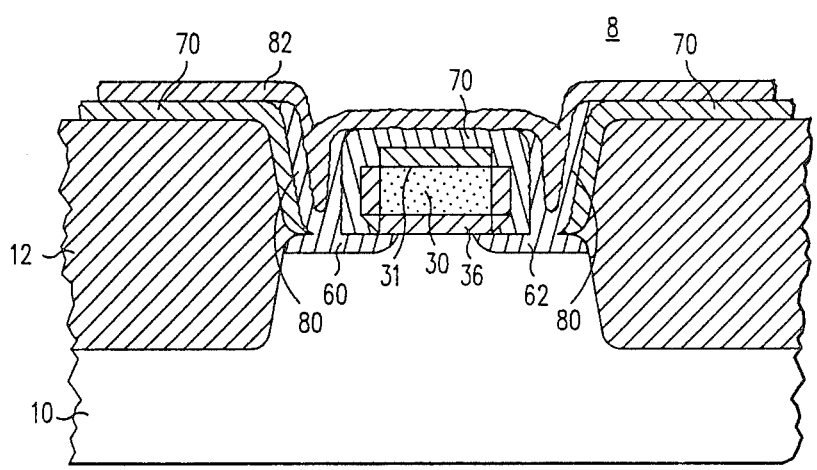

FIGS. 13-15 illustrate the steps required to finish the fabrication of the MOSFET device 8. In FIG. 13, a dielectric layer 70 is deposited over the structure and drain and source contacts 72 and 74, respectively, are opened by conventional means. In FIG. 14, aluminum conductors 80 are deposited and photoshaped and, in FIG. 15, a final dielectric layer 82 is deposited.

Figure 11:
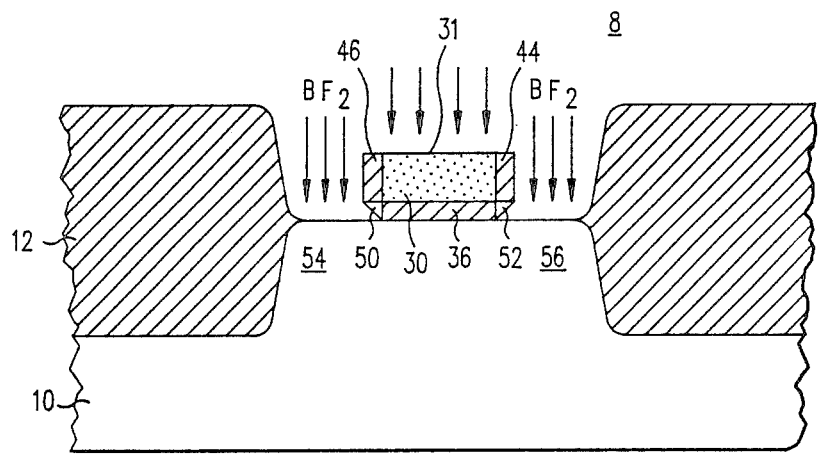
Figure 16:
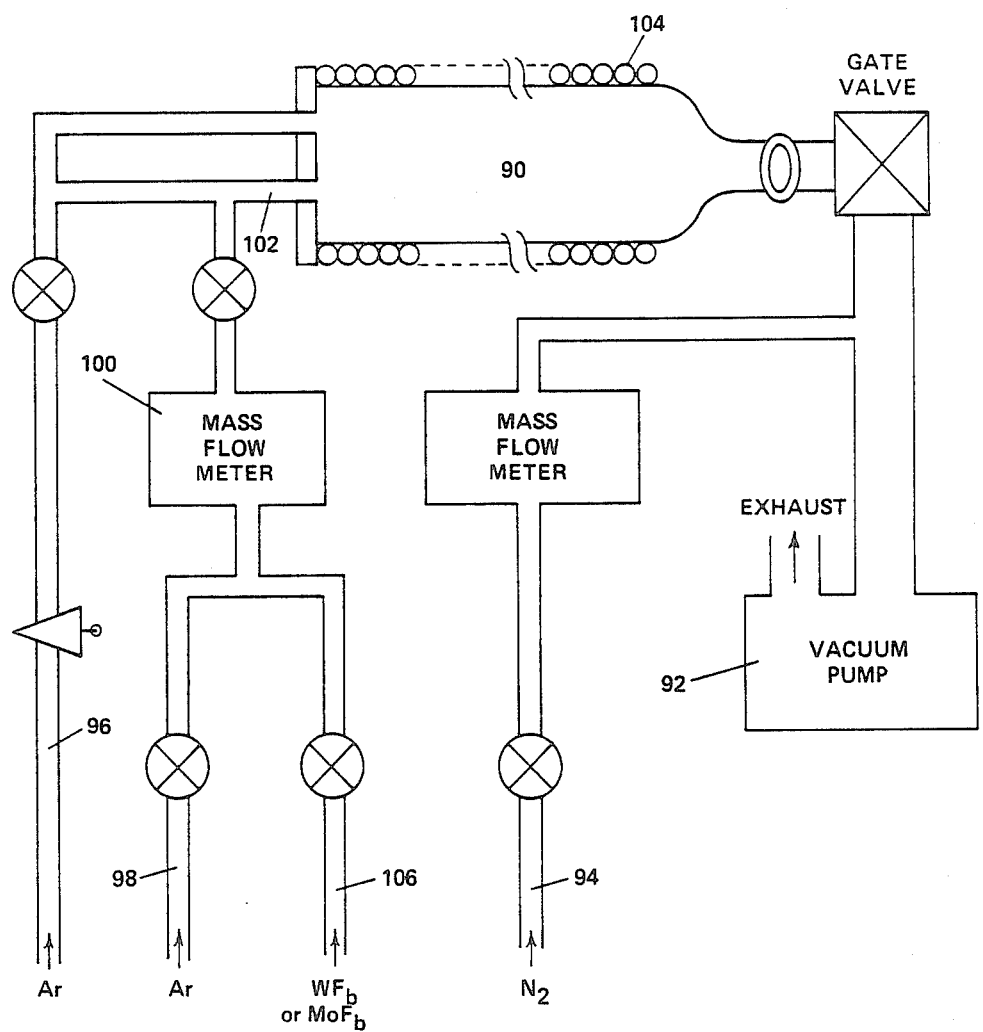

FIG. 16 illustrates schematically a system for chemical vapor deposition of tungsten or molybdenum onto the polycrystalline and single crystalline silicon surfaces of FIG. 11.

After the sample has been subjected to the argon-plasma surface treatment method described above, the sample may be placed in a chemical-vapor deposition chamber 90 as illustrated in FIG. 16. The chamber is then evacuated by a vacuum pump 92 to remove any oxygen in the chamber 90. Nitrogen is provided through a line 94 to assist in the evacuation of oxygen from the chamber 90. After the chamber 90 has been sufficiently evacuated, a line 96 is opened to allow argon to flow into the chamber 90 until a pressure of 0.3 to 3 torr is attained. Argon serves as a carrier gas to provide a more uniform deposition of tungsten or molybdenum. Other inert gases, such as nitrogen or helium, may be used.

After sufficient argon pressure is attained, a line 98 is opened to purge a mass-flow meter 100 and a line 102 leading to the chamber 90 from the line 96 and the flow meter 100. It is important to note that the chamber is heated by elements surrounding the chamber indicated by 104 in FIG. 16. The chamber is heated to a temperature of approximately 300° C. to 500° C. Tungsten or molybdenum hexafluoride is then allowed to flow through the line 106 through the mass-flow meter 100 and into chamber 90 for approximately 5 to 30 minutes.

The preferred deposition temperature range for doped polysilicon is between about 320° C. and 440° C. It should be noted that sheet resistance for both doped and undoped polysilicon generally decreases with temperature up to about 420° C.

The foregoing detailed description is given for clearness of understanding only, and no unnecessary limitations are to be inferred therefrom, as modifications within the scope of the invention will be obvious to those skilled in the art.

I claim:

1. A transistor comprsing:
   (a) a substrate of single crystal silicon having a surface containing drain and source regions;
   (a) a polycrystalline silicon gate electrode having top, bottom, and sidewall surfaces disposed adjacent said drain and source regions and spaced from said substrate by a dielectric layer interposed between said bottom surface of said gate electrode and said substrate surface;
   (c) an oxide layer on said sidewall surfaces of said gate electrode; and
   (d) a metal layer on said drain and source region surfaces, said metal layer extending underneath said sidewall surfaces of said gate electrode, and a gate metal layer top surface of said gate electrode, said metal being selected from the group consisting of tungsten and molybdenum.

2. The transistor of claim 1 wherein said metal layers are deposited by the silicon reduction reaction.

3. The transistor of claim 2 wherein said gate electrode is polycrystalline silicon and said side all oxide is formed by oxidizing said polycrystalline silicon gate electrode.

4. The transistor of claim 3 wherein said sidewall oxide layer has a thickness of at least about 60 Angstoms.

5. The transistor of claim 1 wherein said metal is tungsten.

6. The transistor of claim 1 wherein said metal is molybdenum.

* * * * *